METHOD OF FORMING CONTACTS ON SEMICONDUCTORS

Filed Jan. 27, 1964

INVENTORS
JACK L. LANGDON
WILLIAM E. HARDING
RAYMOND P. PECORARO

BY

J. Jancin Jr.
ATTORNEY 3,266,127

METHOD OF FORMING CONTACTS ON SEMICONDUCTORS

William E. Harding Poughkeepsie, and Jack L. Langdon and Raymond P. Pecoraro, Wappingers Falls, N.Y., assignors to International Business Machines Corporation, New York, N.Y., a corporation of New York Filed Jan. 27, 1964, Ser. No. 340,344
5 Claims. (Cl. 29—155.5)

This invention relates to semiconductor devices or to electrical circuit structures incorporating semiconductor devices and, more particularly, relates to the formation of contacts and interconnections on the semiconductor devices.

It is known to fabricate aluminum ohmic contacts and aluminum interconnections on an oxide-coated semiconductor by etching the desired contact area in the oxide layer to the silicon surface, and selectively depositing aluminum on the oxide surface to form the interconnection as well as, at the same time, depositing aluminum in the etched area to form the ohmic contact. This type of contact-interconnection, however, is not completely satisfactory for a number of reasons. First of all, aluminum, when exposed to air readily forms an oxide on its surface so that any electrical connections made with the oxidized surface of the interconnection will be undesirable because of the high resistivity of the oxide layer. Also, in the same vein, it is very difficult to solder aluminum and poor mechanical bonds usually will result. Moreover, aluminum reacts with the oxide layer of the semiconductor, and, hence, presents the possibility of short circuits by the penetration of aluminum through the oxide layer. At temperatures approaching the eutectic temperature of aluminum and silicon and above, the rate of penetration is appreciable.

It is desirable, therefore, to use in place of the aluminum interconnection, an interconnection of metal which is easily soldered to form a bond of high conductivity and which forms a relatively unreactive, highly adherent bond with the oxide surface of the semiconductor. However, when the above known procedure is employed, it is necessary to include the additional steps of masking only for the contact area prior to etching the contact area in the oxide coating and depositing the aluminum contact and masking for the interconnection area after the aluminum deposit so as to permit depositing the different interconnection metal on the aluminum surface as well as in the desired interconnection pattern on the oxide surface. During the latter masking step, an oxide forms on the aluminum surface and prevents the formation of a good electrical connection as well as a good mechanical bond with the interconnection metal deposited thereon because of the highly resistive oxide layer inbetween.

The primary object of this invention, therefore, is to provide a process for forming an essentially non-penetrating, oxide-adhering, easily soldered interconnection and an aluminum ohmic contact without the formation of an oxide layer at the junction of the contact and interconnection.

A more specific object of this invention is to provide a process for forming an aluminum ohmic contact and an interconnection such that an unoxidized surface of the contact serves as the bonding surface with a surface of the interconnection to eliminate a highly resistive oxide layer at the junction of the contact and interconnection.

Another object of the present invention is to provide a process which enables a photoresist mask of an interconnection area to be removed at the same time as, and in a single operation with the removal of a photoresist mask of a contact area.

In accordance therewith, the present invention comprises the process of selectively depositing an interconnection metal other than aluminum in a desired pattern on an oxide coated semiconductor, etching a contact area through a portion of the interconnection and through the oxide coating to the surface of the semiconductor selectively depositing an aluminum ohmic contact in the etched area so as to cover the oxide-free semiconductor surface and of an area slightly larger in size than the etched area so as to overlap portions of the interconnection adjacent the etched area and form a relatively oxide-free junction between the ohmic contact and the interconnection, and heating the semiconductor to a temperature sufficient to cause the alloying of the contact with the oxide-free surface of the semiconductor.

The foregoing and other objects, features and advantages of the invention will be apparent from the following more particular description of the preferred embodiments of the invention as illustrated in the accompanying drawing.

In the drawing:

FIGS. 1 and 2 are partial cross-sectional views of an oxide-coated semiconductor illustrating the first and second steps of the process of the invention.

FIGS. 3*a*, 4*a* and 5*a* are views similar to FIGS. 1 and 2 illustrating preferred subsequent steps of the process of the invention.

FIGS. 3*b*, 4*b* and 5*b* are views illustrating alternate steps for the preferred steps illustrated by FIGS. 3*a*, 4*a* and 5*a*.

Figure 1:
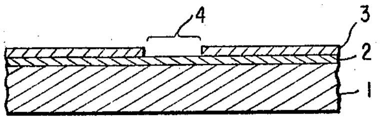

While the invention is applicable to the simultaneous formation of a plurality of contacts and interconnections, the following description will be primarily concerned with the formation of one contact and one interconnection on a silicon-type semiconductor body as partially shown in FIGS. 1–10 and represented at 1. (The invention also is applicable to germanium-type semiconductor bodies, even though the silicon-type mainly will be treated in this description.) As well known in the art, there are, within the body 1 of the semiconductor, extrinsic N-type and extrinsic P-type regions which are formed by diffusing N-type and P-type dopants into an intrinsic semiconductor material.

As shown in all of the figures, the surface of a silicon semiconductor body 1 is coated with an oxide layer 2. This layer may be formed during diffusion of the dopants into the body, at elevated temperatures, by carrying out the diffusion in an oxidizing atmosphere. Methods other than the above preferred thermal oxidation may be used to form the layer 2, such as anodic oxidation and pyrolytic decomposition of siloxanes. This layer may be one micron or more in thickness and, in the present instances, consists chiefly of silicon dioxide, although silicon monoxide may constitute the layer 2, if desired. If a germanium-type semiconductor is used, it is preferred to coat with silicon monoxide using techniques well known in the art. In both cases, the oxide surface is durable and firmly adherent to the semiconductor body. Furthermore, it can serve as a good electrical insulator between the semiconductor body and an interconnection metal deposited on the oxide layer, if the metal, such as aluminum, does not react with the layer and penetrate through to one of the regions in the semiconductor body 1. Because of this, a glass protective layer may be coated on the oxide layer using a technique well known in the art or may be used in place of the oxide layer if desired.

For connecting the semiconductor body 1 into a circuit, contacts must be formed on the N and P regions of the semiconductor and interconnections attached to the contacts. Ohmic contacts are the most desirable because they have linear current conducting characteristics in both directions and have a resistance which is the inherent resistance of the semiconductor body material. Conductive metals found to exhibit these characteristics are aluminum, gold, palladium, and platinum. However, of these ohmic metals aluminum is the most preferred because, compared with the others, it is relatively inexpensive. Also, aluminum contacts permit the use of certain protective glass coatings for encasing the completed semiconductor. These glass coatings have a coefficient of expansion approaching the coefficient of expansion of silicon and, therefore, are most desirable.

According to common prior practices in fabricating contacts and interconnections on semiconductors, the material used for the interconnection normally is the same material as the ohmic contact, namely aluminum, and is deposited either at the same time or at a subsequent time thereto. In the process of the present invention, however, the interconnection material is different from the contact material and is deposited prior to the deposition of the contact. Also, the interconnection metal preferably is bimetallic. Silver and nickel may be used for the upper layer. The lower layer is chromium or, if desired, the chromium layer may be replaced with molybdenum because molybdenum, like chromium, is relatively unreactive even at the alloying temperatures of aluminum and silicon (their eutectic temperature) and readily adheres to oxide surfaces. Thus, because of their unreactivity with the oxide layer 2, neither of them will penetrate through the oxide layer and short circuit the semiconductor body 1. Moreover, the upper layer, whether it can be nickel or silver, is highly conductive and is easily soldered and now is fully insulated from the semiconductor body. Furthermore, none of these metals readily form an oxide at room temperature or at baking temperatures of 200° C. If desired, the upper layer may be applied directly to the oxide layer to form the interconnection.

To apply the interconnection material to the oxide surface in the desired geometric pattern, a convenient and highly accurate way is to use photoengraving techniques well known in the art. (This technique is fully described in "Micro-electronics Theory, Design and Fabrication," edited by Edward Keonjian, McGraw-Hill Book Company, Inc., 1963.) As shown in FIG. 1, a layer of photoresist 3 is placed over the oxide layer of the semiconductor 1 and exposed through a master photographic plate having an opaque area corresponding to the area of an interconnection. Following the usual photographic developing, the unexposed resist is removed to leave interconnection area referenced by the numeral 4 in FIG. 1.

While various known methods may be employed for depositing the interconnection material on the oxide-coated semiconductor, it is preferred to use direct vacuum evaporation after baking the semiconductor or so formed at approximately 200° C. and cleaning especially the portion of the oxide surface 2 on which the deposited material is to remain. Using the nickel-chromium material by way of example, it is further preferred to vapor deposit the two metals in a continuous sequence in which only chromium is deposited first, followed by a phasing out of chromium and a phasing in of nickel. The sequence is then completed with a deposit of nickel only. By resorting to this continuous sequence, an intermetallic interface joins the two deposited metals and increases the strength of their junction. In the present instance, chromium is deposited to a thickness of approximately 100 A. and nickel to a thickness of approximately 5000 A.

Figure 2:
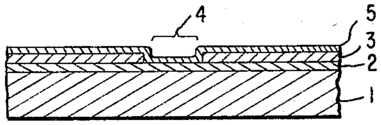
Figure 3A:
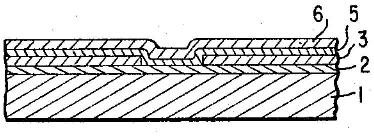
Figure 4A:
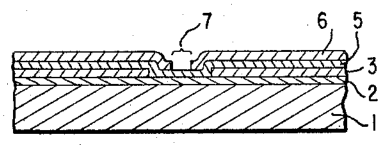
Figure 5A:
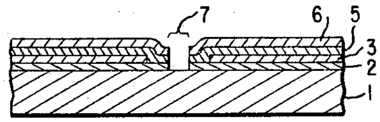

As shown in FIG. 2, the nickel-chromium deposit forms a layer 5 on the oxide surface of interconnection area 4 and over the unremoved exposed photoresist 3. In the preferred process of the invention the exposed photoresist 3 and the layer 5 are kept intact. To the layer 5, a second layer 6 of photoresist is applied as shown in FIG. 3*a*. Following the same well-known techniques as above, the layer 6 is exposed through a master photographic plate which, this time, has an opaque area corresponding to the contact area. The opaque area is confined within the interconnection area and over either a N or P region in the semiconductor body 1. After developing, the unexposed photoresist is removed to leave the contact area 7 as shown in FIG. 4*a*. A chemical etchant is now employed to etch through the underlying interconnection layer 5 and the oxide layer 2 to the surface of the semiconductor body 1 as shown in FIG. 5*a*. For etching through the interconnection layer 5 and the oxide layer 2 a potassium iodide solution is used followed by the usual etchant for etching the oxide layer, namely buffered hydrogen fluoride.

Figure 3B:
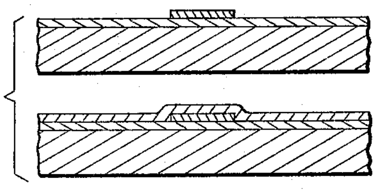
Figure 4B:
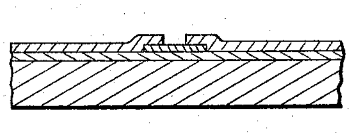
Figure 5B:
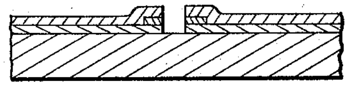

In an alternate procedure for comparison purposes, as illustrated by FIGS. 3*b*, 4*b*, and 5*b*, the first photoresist layer 3 is removed and the overlay of interconnection metal is removed with it to leave the interconnection referenced by the numeral 8 in FIG. 3*b*. The second photoresist layer 6 is now applied over the interconnection 8 and the oxide layer 2. The remaining steps illustrated by FIGS. 4*b* and 5*b* are the same as preferred procedure, i.e.—exposing, developing and removing the unexposed photoresist (FIG. 4*b*) etching through the interconnection 8 and oxide layer 2 to the surface of the semiconductor body 1 (FIG. 5*b*).

Figure 6:
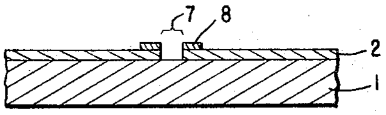
FIGS. 6, 7, 8 and 9 are views illustrating further subsequent steps of the process of the invention.

All of the exposed photoresist is now removed to leave the interconnection 8 as well as the contact area uncovered as shown in FIG. 6. In the preferred procedure of FIGS. 3*a*, 4*a*, and 5*a*, this includes the removal of both layers 3 and 6 and thereby completes in one step the two removal steps of the alternate procedure illustrated by FIGS. 3*b*, 4*b*, and 5*b*.

Figure 7:
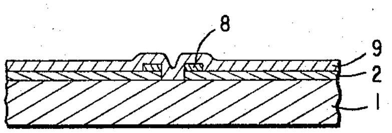
Figure 8:
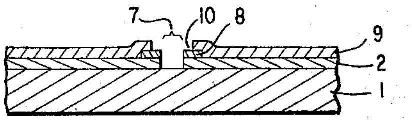

As shown in FIG. 7, a third photoresist layer 9 is applied to cover the oxide layer 2, the interconnection 8 thereon, and the contact area 7. Again, using the above techniques, photoresist layer 9 is exposed through a master photographic plate having an opaque area aligned with the contact area, but slightly larger in size so that, after the development of the exposed photoresist and removal of the unexposed photoresist, a portion 10 of the interconnection adjacent the contact area is uncovered as shown in FIG. 8.

Figure 9:
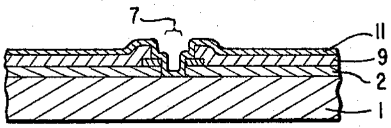
Figure 10:
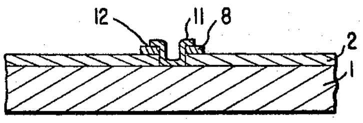
FIG. 10 is a partial cross-sectional view of the oxide-coated semiconductor having a contact and interconnection deposited thereon.

After baking at approximately 200° C. and cleaning the semiconductor so formed, ohmic contact metal 11, herein aluminum, is deposited, as shown in FIG. 9 in the contact area and on the uncovered interconnection portion 10 as well as on the exposed photoresist layer 9. As in the case of the deposition of the interconnection material, it is preferred to use direct vacuum evaporation of the ohmic contact metal, i.e., aluminum, which, in this instance is a deposit of approximately 8000 A. After the deposition, the photoresist layer 9 is removed, leaving, as shown in FIG. 10, the oxide-coated semiconductor with the interconnection 8 and contact 10 formed thereon. It should be apparent that by depositing the aluminum contact metal on the interconnection, rather than depositing the interconnection metal on the aluminum contact, an oxide layer is unable to form on the junction surface 12 of the aluminum contact 11. Moreover, the junction surface of the interconnection metal 8 is not readily oxidized and, therefore, the junction is highly conductive.

The semiconductor having the contact and interconnection formed thereon is now heated to a temperature sufficient to alloy the contact to the semiconductor. In the case of an aluminum contact and a silicon semiconductor, a temperature of about 575° C. is suitable for this purpose.

The completed semiconductor or the circuit incorporating the semiconductors usually is covered with a protective glass coating after all the contacts and interconnections have been fabricated. Preferably, the glass material should have a coefficient of expansion matching as close as possible the coefficient of expansion of the semiconductor material.

Suitable glasses having such a desired coefficient of expansion normally are applied at temperatures around 560° C. and, therefore, the use of gold for the contact 11 (FIG. 10) is not preferred because gold will penetrate deeper into the silicon semiconductor at these temperatures. Aluminum, however, does not penetrate at these temperatures, when the semiconductor is coated with such glasses and, therefore, is highly satisfactory.

With this protective glass coating arrangement, a hole is etched through the glass coating to the interconnection, using known masking and etching techniques, when it is desired to make an electrical connection with the semiconductor or the circuit incorporating the semiconductor. A connection lead is then soldered to the interconnection.

While the invention has been particularly shown and described with reference to preferred embodiments thereof, it will be understood by those skilled in the art that various changes in form and details may be made therein without departing from the spirit and scope of the invention.

We claim:

1. In the process of forming a contact and an interconnection on a semiconductor having an oxide coating thereon, the steps comprising:

selectively depositing a highly conductive, easily soldered, oxide-adhering metal on an oxide-coated semiconuctor to form an interconnection on the oxide surface;

etching a contact area through a portion of said interconnection and through the oxide coating to the surface of the semiconductor;

selectively depositing an aluminum ohmic contact in the etched contact area so as to cover the semiconductor surface and to overlap at least on a portion of the interconnection adjacent the etched contact area; and heating the semiconductor, having said interconnection metal and said contact metal deposited thereon, to a temperature sufficient to cause the alloying of the aluminum contact with the surface of the semiconductor.

2. The process of claim 1 wherein said interconnection metal comprises an oxide-adhering layer and a highly conductive, easily soldered layer joined together by an intermetallic interface.

3. In the process of forming a contact and an interconnection on a semiconductor having an oxide coating thereon, the steps comprising:

selectively depositing, in a continuous sequence, an oxide-adhering metal selected from the group consisting of chromium and molybdenum and a highly conductive, easily soldered metal selected from the group consisting of nickel and silver, on an oxide-coated semiconductor to form an interconnection on the oxide surface;

etching a contact area through a portion of said interconnection and through the oxide coating to the surface of the semiconductor;

selectively depositing an ohmic contact metal in the etched contact area so as to cover the semiconductor surface and to overlap at least one portion of the interconnection adjacent the etched area; and heating the semiconductor, having said interconnection metal and said contact metal deposited thereon, to a temperature sufficient to cause the alloying of the contact metal with the surface of the semiconductor.

4. The process of claim 3 wherein said interconnection metal is nickel-chromium and said contact metal is aluminum.

5. In the process of forming an aluminum ohmic contact and a chromium-nickel interconnection on a silicon semiconductor having an oxide coating thereon, the steps comprising:

forming a first photoresist layer, on one side of an oxide-coated semiconductor, with a portion of the oxide surface uncovered which is representative of an interconnection area for the semiconductor;

depositing in a continuous sequence a chromium-nickel layer on said uncovered oxide surface to serve as an interconnection for the semiconductor, said chromium being deposited first to provide an adhesive bond with the oxide surface;

forming a second photoresist layer on said one side of the semiconductor with a portion of said interconnection uncovered which is representative of a contact area of the semiconductor;

etching through the uncovered portion of said interconnection and the underlying oxide layer to a portion of the silicon surface of the semiconductor;

removing said first and second layers of photoresist and the nickel-chromium sandwiched inbetween to leave remaining the etched interconnection on the oxide surface of the semiconductor;

forming a third photoresist layer to said one side of the semiconductor with said portion of the silicon surface of the semiconductor and an adjacent portion of said interconnection uncovered;

depositing an aluminum layer on the uncovered portion of the silicon surface and on the uncovered adjacent portion of said interconnection to serve as a contact for the semiconductor and to form a connection with said interconnection; and heating said semiconductor to a temperature sufficient to cause alloying between opposing surfaces of said contact and said semiconductor.

No references cited.

HYLAND BIZOT, *Primary Examiner.*